United States Patent
Kawakubo et al.

(10) Patent No.: US 6,797,957 B2
(45) Date of Patent: Sep. 28, 2004

(54) INFRARED DETECTION ELEMENT AND INFRARED DETECTOR

(75) Inventors: Takashi Kawakubo, Kanagawa-ken (JP); Kazuhide Abe, Kanagawa-ken (JP); Kenya Sano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/097,405

(22) Filed: Mar. 15, 2002

(65) Prior Publication Data

US 2002/0130263 A1 Sep. 19, 2002

(30) Foreign Application Priority Data

Mar. 15, 2001 (JP) ........................................ 2001-074541

(51) Int. Cl.[7] .............................. H01L 37/02; G01J 5/10
(52) U.S. Cl. .................................................... 250/338.2
(58) Field of Search ........................ 250/338.2, 338.3, 250/338.1

(56) References Cited

U.S. PATENT DOCUMENTS

| | | | |
|---|---|---|---|
| 3,604,933 A | * | 9/1971 | Cross et al. |
| 5,448,067 A | * | 9/1995 | Micheli et al. |
| 5,739,563 A | | 4/1998 | Kawakubo et al. |
| 5,760,432 A | | 6/1998 | Abe et al. |
| 5,818,043 A | * | 10/1998 | Buchy et al. |
| 6,096,434 A | * | 8/2000 | Yano et al. |
| 6,326,621 B1 | * | 12/2001 | Kamada et al. |
| 6,339,221 B1 | * | 1/2002 | Schubring et al. |
| 6,388,255 B1 | * | 5/2002 | Di Maio et al. |
| 2001/0015448 A1 | | 8/2001 | Kawakubo et al. |

* cited by examiner

*Primary Examiner*—Albert Gagliardi
(74) *Attorney, Agent, or Firm*—Oblon, Spivak, McClelland, Maier & Neustadt, P.C.

(57) ABSTRACT

An infrared detection element having a single-crystalline base layer 3 with a thickness of 50 nm to 10 $\mu$m having a principal surface, a first electrode layer 4 formed on the principal surface of the single-crystalline base layer 3, a ferroelectric layer 5 which is formed on the first electrode layer 4 and is composed of a single-crystalline layer or a unidirectionally oriented layer. Distortion of the single-crystalline layer or a unidirectionally oriented layer in a surface parallel to the principal surface of the single-crystalline base layer 3 is elastically constrained by the single-crystalline base layer 3. The infrared detection element further has a second electrode layer 6 formed on the ferroelectric layer 5. An amount of charge varies with changes in temperature caused by irradiation of infrared light to the ferroelectric layer 5.

16 Claims, 7 Drawing Sheets

FIG. 1

PRIOR ART

FIG. 2

PRIOR ART

FIG. 3

PRIOR ART

INFRARED DETECTION ELEMENT AND INFRARED DETECTOR

BACKGROUND OF THE INVENTION

The present invention relates to an infrared detection element using the temperature dependence of spontaneous polarization of ferroelectrics. As an infrared detection element generally used for consumer appliances, there is a pyroelectric infrared detection element using the characteristics of changing of spontaneous polarization due to temperature changes.

In the pyroelectric infrared detection element, infrared light supplied to an infrared detection element periodically interrupted by a chopper. According to temperature dependence of the infrared detection element synchronized with the interruption frequency by the chopper, the infrared detection element is charged. The charge is amplified by an amplifier and read as a current or a voltage, thus infrared light is detected.

Figure 1:
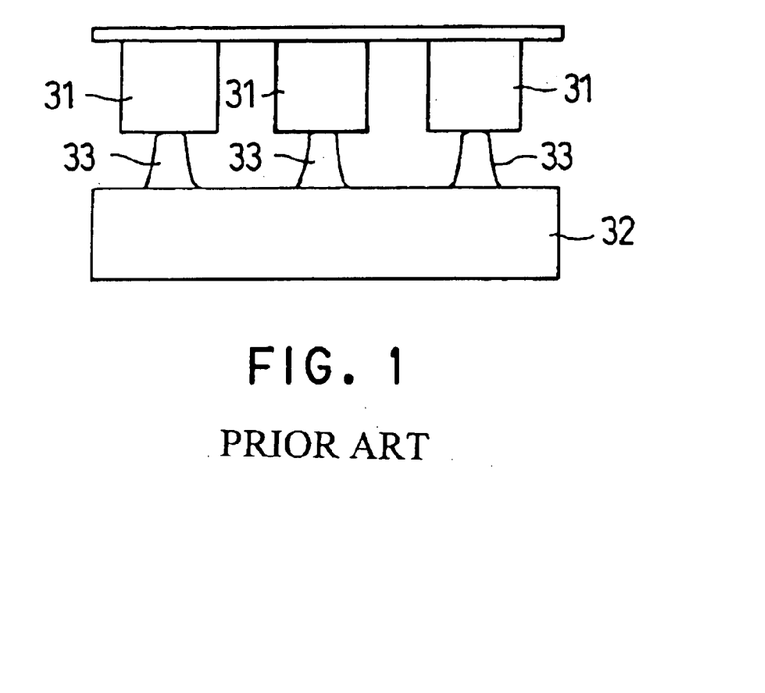
FIG. 1 is a side view showing an example of a conventional pyroelectric infrared detection element.

An example of a conventional pyroelectric infrared detection element already put into practical use is shown in FIG. 1. A pyroelectric element is made of a ceramics sintered substance 31 of barium strontium titanate (hereinafter, abbreviated to BST) having a heat-insulating structure, in which the element is stuck onto a Si IC substrate 32 for reading via metallic bumps 33 so as to improve the sensitivity and response speed. In the pyroelectric element of the kind using ceramics, there is a limit to decrease a size of each element, since it is extremely difficult to control the thickness and horizontal length of the element to several tens $\mu$m or less. There is also a problem particularly in the response speed because a heat capacity of the element is large, thereby making it difficult to provide a small and light sensor.

Figure 2:
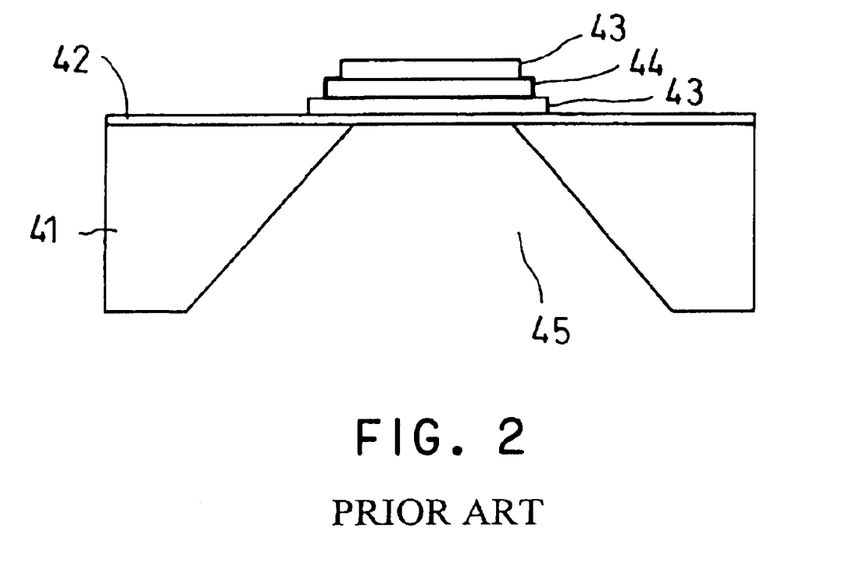
FIG. 2 is a side view showing an example of a conventional infrared detection element using a thin pryroelectric film.

Further, to solve such problems of the infrared detection element using a pyroelectric substance, production of an infrared detection element using a thin pyroelectric film has been tried. An example of a conventional infrared detection element using a thin pyroelectric film is shown in FIG. 2. As shown in the drawing, an infrared detection element 44 composed of a thin polycrystalline BST film held by upper and lower electrodes 43 is formed on the surface of an Si substrate 41 via a thin amorphous SiN (silicon nitride) support film 42. To realize the heat-insulating structure, an open space 45 by anisotropic etching is formed at the back of the Si substrate 41.

However, a pyroelectric property of such a thin polycrystalline BST film, particularly ferroelectricity that is a basis for development of the pyroelectricity, is far inferior to that of BST ceramics sintered at a high temperature. Moreover, the thinner the film is made, the more degraded are the ferroelectricity and the pyroelectric property in the prior art. Namely, when a thin polycrystalline pyroelectric film is used, the infrared detection element can be made thin and small. There is, however, a problem arises that the detection sensitivity is greatly reduced.

To make rapid improvement in the ferroelectric property and the pyroelectric property of such a thin pyroelectric film, a method for using a thin single-crystalline pyroelectric film by epitaxial growth has been proposed (see Japanese Patent No. 3094753).

Figure 3:
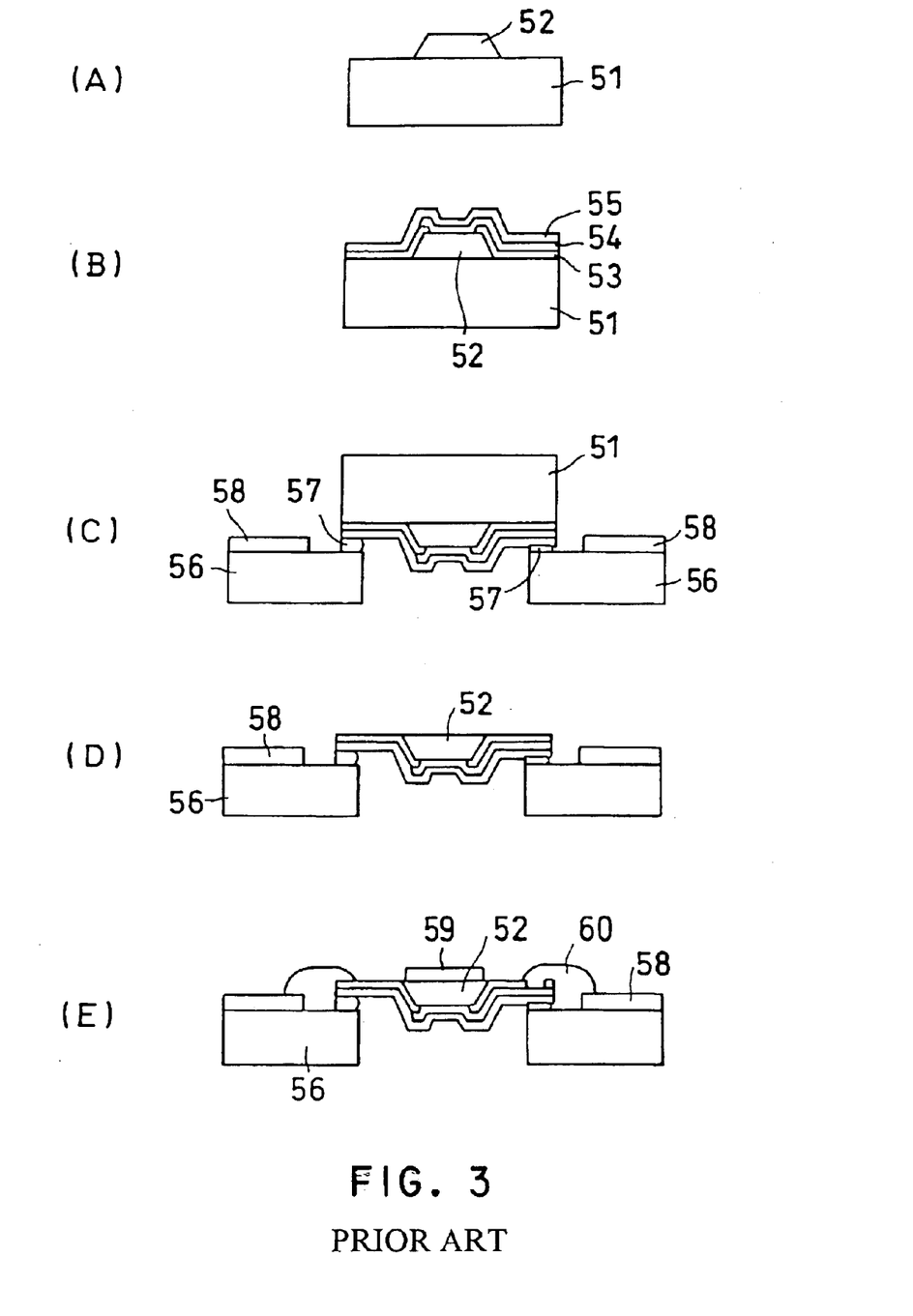
FIG. 3 is a side view exemplary showing a manufacturing process of a conventional infrared detection element using a thin single-crystalline pryroelectric film.

A manufacturing process of a conventional infrared detection element using the thin single-crystalline pyroelectric film is exemplary shown in FIG. 3. As shown in the drawing, a thin single-crystalline film 52 of lantern-added lead titanate (hereinafter, abbreviated to PLT) by epitaxial growth is prepared and patterned on a single-crystalline MgO substrate 51(A). A first polyimide film 53 for supporting, a lower electrode 54, and a second polyimide film 55 are sequentially deposited and patterned (B). The single-crystalline MgO substrate 51 is inversely bonded on an alumina substrate 56 processed beforehand via a metallic bump 57. On the alumina substrate 56, a lead wire 58 is formed(C). The single-crystalline MgO substrate 51 is removed by etching (D). A photo detector electrode 59 is formed on the exposed surface of the thin PLT film 52. Here, the first polyimide film 53 is partially removed, and the lower electrode 54 is exposed. Conductive paste 60 and the lead wire 58 are, then, electrically connected on the surface thereof, and the thin PLT film 52 is bonded onto the alumina substrate 56(E).

The infrared detector composed of a thin single-crystalline PZT film with the heat resistant support, which is manufactured through such a complicated process as described, proved that the sensitivity is far higher than that of a detector composed of a thin polycrystalline film. However, there are problems in the infrared detector that the manufacturing process is complicated, that the yield rate is low, and that the cost is high.

Having made a number of experiments and theoretical analyses to improve the performance of an infrared detector using such a thin single-crystalline pyroelectric film, the inventors have found for the first time limits or problems on use of the thin single-crystalline pyroelectric film supported in the air. The discovered problems will be described hereunder in detail.

BaTiO3, one of the ferroelectrics for example, shows a primary phase transition in a following manner as temperature rises from a low temperature; rhombohedral crystal rhombic crystal→tetragonal crystal→cubic crystal. Further, when the temperature becomes lower from a high temperature, a primary phase transition, from cubic crystal to tetragonal crystal occurs inversely. In the course of the phase transition from the cubic crystal to the tetragonal crystal due to the temperature decrease, a and b axes shrink by about 0.005 Å and c axis extends by 0.01 Å, from their original length of 4.01 Å at the curie temperature. With the phase transition, spontaneous polarization of 18 $\mu$C/cm$^2$ is generated in the crystal.

This discontinuous change of the lattice constant in the phase transition of the ferroelectrics brings about a discontinuous change in the temperature property of the spontaneous polarization. The discontinuous changes of the spontaneous polarization with the temperature in the neighborhood of the Curie temperature make accurate temperature measurement unable in the neighborhood of the Curie temperature.

SUMMARY OF THE INVENTION

The present invention provides an infrared detection element, which eliminates a discontinuous primary phase transition of ferroelectrics based on the fact described, and enables the accurate temperature measurement even in the neighborhood of the Curie temperature.

Further, the present invention is made to provide an infrared detection device incorporating the infrared detection element.

The infrared detection element according to the present invention has a single-crystalline base layer with a thickness of 50 nm to 10 $\mu$m having a principal surface, a first electrode layer formed on the principal surface of the single-crystalline layer, a ferroelectric layer which is formed on the first electrode layer and composed of a single-crystalline layer or a unidirectionally oriented layer with which distortion in a direction within a surface parallel to the principal surface of the single-crystalline base layer is elastically constrained, and a second electrode layer formed on the ferroelectric layer, wherein an amount of charge of the ferroelectric layer of the infrared detection element is detected as an electric signal from the first and second electrode layer.

In the infrared detection element according to the present invention, the elastic restriction on the ferroelectric layer is not sufficient when the thickness of the single-crystalline base layer is less than 50 nm. However, when the thickness of the single-crystalline base layer is more than 10 $\mu$m, heat capacity becomes large and the response to infrared light thus becomes slow.

Further, in the infrared detection element of according to the present invention, it is preferable that the ferroelectric layer has the perovskite structure so that the amount of charge in the ferroelectric layer may change depending on the temperature change caused by irradiation of infrared light.

Further, in the infrared detection element according to the present invention, it is preferable that the ferroelectric layer has a main component of $Ba_{1-x}Sr_xTiO_3$ ($0 \leq x \leq 1$).

Further, in the infrared detection element according to the present invention, the first electrode layer is a noble metal layer such as Au, Pt or a conductive oxide layer of the perovskite structure and having a thickness of preferably 1 $\mu$m or less, thereby effectively transferring the elastic restrictive force of the single-crystalline layer to the ferroelectric layer.

Further, in the infrared detection element according to the present invention, it is preferable that the single-crystalline layer is a single-crystalline silicon layer having a surface oriented to (001) direction and the ferroelectric layer is grown so as to have a surface oriented to (001) direction through an epitaxial growth or any other manufacturing method.

Further, in the infrared detection element according to the present invention, it is preferable that the a and b axes of the ferroelectric layer are formed within a surface parallel to the principal surface of the semiconductor layer and the c axis of the ferroelectric layer is formed in a direction perpendicular to the principal surface of the semiconductor layer.

Further, the infrared detection element according to the present invention has a single-crystalline base layer with a thickness of 50 nm to 10 $\mu$m having a principal surface, a first electrode layer formed on the principal surface of the single-crystalline layer, a ferroelectric layer which is formed on the first electrode layer and composed of a first single-crystalline layer or a unidirectionally oriented layer that the distortion in a surface parallel to the principal surface of the single-crystalline base layer is elastically constrained by the single-crystalline base layer, an infrared detection element having a second electrode layer formed on the ferroelectric layer, a third electrode layer formed on the principal surface of the single-crystalline layer, a second ferroelectric layer which is formed on the third electrode layer and composed of a single-crystalline layer or a unidirectionally oriented layer with which distortion in a direction within a surface parallel to the principal surface of the single-crystalline base layer is elastically constrained, a reference cell having a fourth electrode layer formed on the ferroelectric layer, and an infrared reflection film formed on the reference cell, wherein a charge of the ferroelectric layer of the infrared detection element is detected as an electric signal from the first and second electrode layer, a charge of the ferroelectric layer of the reference cell is detected as an electric signal from the third and fourth electrode layer, and the difference between the electric signals is detected.

Further, the infrared detection element according to the present invention has a single-crystalline base layer with a thickness of 50 nm to 10 $\mu$m having a principal surface, a first electrode layer formed on the principal surface of the single-crystalline layer, a first ferroelectric layer composed of a single-crystalline layer which is fixed to the first electrode layer, an infrared detection element having a second electrode layer formed on the ferroelectric layer, a third electrode layer formed on the principal surface of the single-crystalline base layer, a second ferroelectric layer composed of a single-crystalline layer which is fixed to the third electrode layer, a reference cell having a fourth electrode layer formed on the ferroelectric layer, and an infrared reflection film formed on the reference cell, wherein a charge of the ferroelectric layer of the infrared detection element is detected as an electric signal from the first and second electrode layer, a charge of the ferroelectric layer of the reference cell is detected as an electric signal from the third and fourth electrode layer, and the difference between the electric signals is detected.

DESCRIPTION OF THE PREFERRED EMBODIMENTS

To consider the theory of a discontinuous primary phase transition of ferroelectrics, the inventors simulated the relation between the lattice constant and the temperature of a single crystal $BaTiO_3$ introducing the Legendre transformation.

Figure 4:
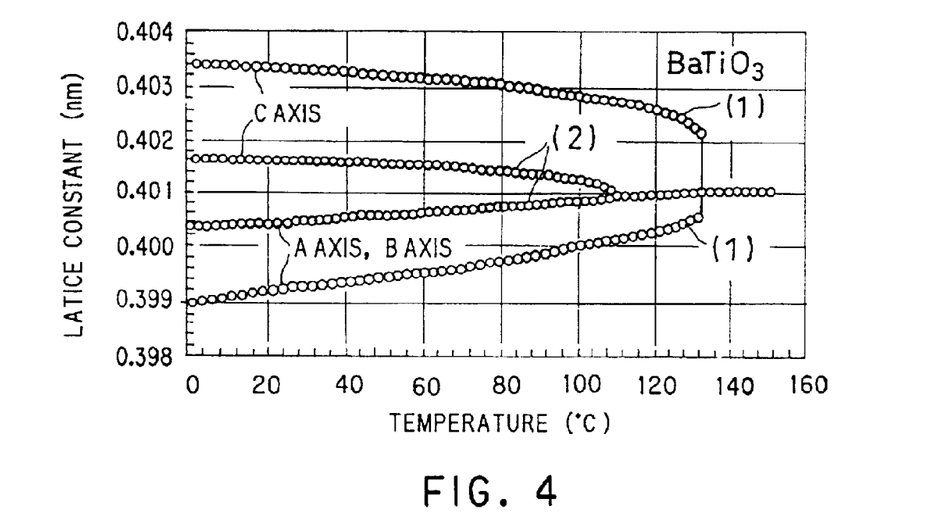
FIG. 4 is a graph showing simulation results executed by the inventors, which shows a relation between a lattice constant and a temperature of a single crystal $BaTiO_3$ in both cases where "a", "b" and "c" axes of the crystal are not constrained and where "a" and "b" axes are constrained and the "c" axis is not constrained.

FIG. 4 is a graph showing the results. The lines (1) in FIG. 4 show the property indicating the relation between the temperature and the lattice constant when "a", "b" and "c" axes of the single crystal $BaTiO_3$ are not fixed. The lines in (2) show the property indicating the relation between the temperature and the lattice constant when "a" and "b" axes of the single crystal $BaTiO_3$ are fixed and only the "c" axis is not fixed. In lines (1) and (2), the lower line indicates the property indicating the relation between the temperature and the lattice constant of "a" and "b" axes and the upper line indicates the property indicates the relation between the temperature and the lattice constant of the "c" axis.

As shown with the lines (1) in FIG. 4, indicating the property of the single crystalline $BaTiO_3$ when "a", "b" and "c" axes are not fixed, a large difference between the lattice constant of "a", "b" and "c" axes is seen with discontinuity at the Curie temperature (about 132° C.). This is due to the difference of the crystal structures in the lower and upper side of the Curie temperature (about 132° C.). That is, the single crystalline $BaTiO_3$ is a tetragonal crystal in the lower side and is a cubic crystal in the higher temperature side. There is a relation of primary phase transition between the tetragonal crystal and the cubit crystal.

On the other hand, as shown in the property (2) of the single crystal $BaTiO_3$ when the "a" and "b" axes are fixed and the "c" axis is not fixed, it is seen that the lattice constant of the "a" and "b" axes and that of the "c" axis slowly change at a lower side of the Curie temperature (about 132° C.). This is due to the occurrence of a continuous secondary phase transition between a tetragonal crystal and a cubit crystal instead of the primary phase transition by restricting the movement of the single crystal $BaTiO_3$ in the directions of the "a", "b" and "c", axes and by not restricting the movement in "c" axis, even though the single crystalline $BaTiO_3$ have a tetragonal crystal structure on the lower side and a cubic crystal structure on the higher side of the Curie temperature (about 132° C.).

Further, the inventors simulated the relation between the spontaneous polarization and the temperature of the single crystal $BaTiO_3$ based on the results shown in FIG. 4.

Figure 5:
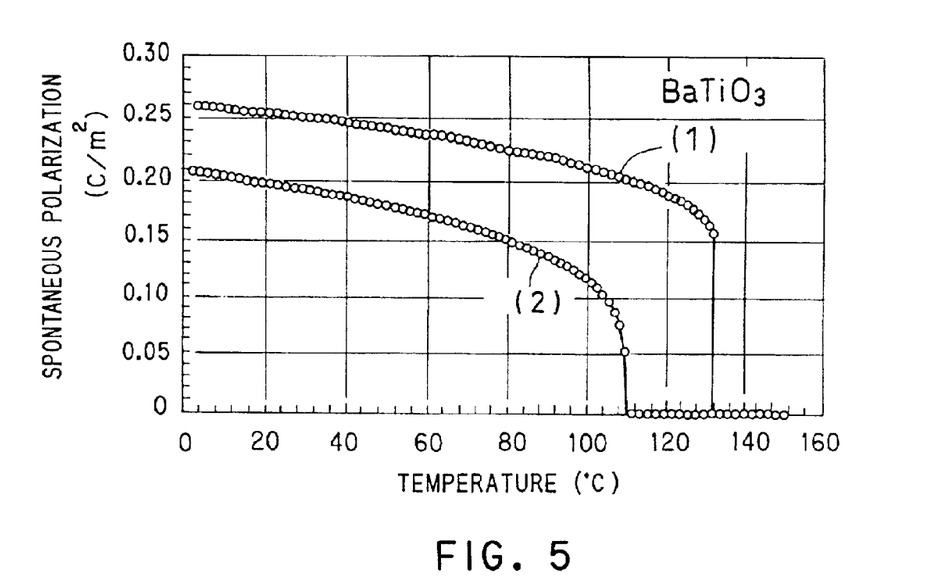
FIG. 5 is also a graph showing the simulation results executed by the inventors, which shows a relation between spontaneous polarization and a temperature of the single crystal $BaTiO_3$ in both cases where the "a", "b" and "c" axes are not constrained and where the "a" and "b" axes are constrained and the "c" axis is not constrained.

FIG. 5 is a graph showing the results. The line (1) in FIG. 5 shows the property indicating the relation between the temperature and the spontaneous polarization when b and "c" axes of the single crystal $BaTiO_3$ are not fixed. The line (2) shows the property indicating the relation between the temperature and the spontaneous polarization when "a" and "b" axes of the single crystal $BaTiO_3$ are fixed and "c" axis is not fixed.

As shown with the line (1) in FIG. 5, the spontaneous polarization greatly differs on the both sides of the Curie temperature (about 132° C.) with discontinuity. With the single crystal having such spontaneous polarization that greatly changes with discontinuity, accurate temperature measurement is very difficult in the neighborhood of the Curie temperature. Further, the differential of the property, in other words, the inclination of the graph in the range from 100° C. to 130° C., which is lower than the Curie temperature (about 132° C.), is gentle, so that variation in a charge caused by a change in the spontaneous polarization is also slight. Accordingly, a sufficient amount of an electric signal cannot be obtained in accordance to the change in the temperature, so that the infrared detection element having low sensitivity is obtained.

On the other hand, as shown with the property (2) in FIG. 5, the change in the spontaneous polarization is not so large compared with that of the property (1) due to the occurrence of the secondary phase transition on the both sides of Curie temperature (about 132° C.). Furthermore, the differential of the property, in other words, the inclination of the graph, is large in a range from 80° C. to 110° C., which is lower than the curie temperature (about 132° C.), compared with that of the property (1), so that variation in a charge caused by a change in the spontaneous polarization is also large. Therefore, a infrared detection element can be obtained providing a very large electric signal in accordance with a change in the temperature and having a high sensitivity by keeping the whole infrared detection element at a temperature lower than the Curie temperature.

In the aforementioned experiment, $BaTiO_3$ is used as a ferroelectric material. However, other ferroelectric materials such as BST or PLT can be used with an equal effect. When $BaTiO_3$ is used as a ferroelectric, the Curie temperature for restricting the distortion of the crystal within a surface is higher than a room temperature of, for example, 112° C. However, when BST having a composition of about $Ba_{0.5}Sr_{0.5}TiO_3$, in which a part of Ba of $BaTiO_3$ is replaced with Sr is used, the Curie temperature can be selected to be a temperature close to the room temperature, which is convenient to the infrared detection element.

Based on the result described, the present invention provides an infrared detection element having a single-crystalline base layer with a thickness of 50 nm to 10 μm having a principal surface, a first electrode layer formed on the principal surface of the single-crystalline layer, a ferroelectric layer formed on the first electrode layer being composed of a single-crystalline layer or a undirectionally oriented layer so that distortion in crystalline structure of the ferroelectric layer in a plain parallel to the principal surface of the single-crystalline base layer is elastically constrained by the single-crystalline base layer, and a second electrode layer formed on the ferroelectric layer, wherein an amount of a charge changes in accordance with a change in a temperature caused by irradiation of infrared light and the amount the charge is detected as an electric signal from the first and second electrode layers.

More specifically, a highly sensitive infrared detection element can be realized exhibiting a property shown lines (2) in FIGS. 4 and 5 by forming the ferroelectric layer composed of a single-crystalline layer or a undirectionally oriented layer on the base substrate and elastically restricting the crystalline structure of a ferroelectric layer in the plain parallel to a surface of the base substrate.

The thickness of the single-crystalline layer forming the base substrate for the ferroelectric layer is selected between 50 nm and 10 μm. The reason is that when the thickness is less than 50 nm, the lattice constant of the ferroelectric layer cannot be constrained sufficiently in a plain parallel to the surface of the substrate. Further, the reason is that when the thickness is selected larger than 10 μm, heat capacity becomes large, which make it difficult for heat radiate quickly, and sensitivity gets worse. More preferably, the thickness is between 200 nm and 2 μm.

Further, to sufficiently fix the lattice constant of the ferroelectric layer in the plain parallel to the surface of the substrate, the thickness of the ferroelectric layer is preferably thinner than that of the single-crystalline layer of the base.

Further, a semiconductor crystal such as silicon or a compound semiconductor single crystal such as SiGe or GaAs may be used for the single-crystalline base layer.

Further, a silicon single-crystalline substrate having a surface oriented to (100) direction is preferable for the epitaxial growth or oriented growth of the ferroelectric layer.

Further, a conductive oxide having a perovskite structure is preferable for the first electrode layer. The reason is that the bonding between the single-crystalline base layer forming the base substrate and the ferroelectric layer forming the upper layer is made strong and the single-crystalline base layer constraines the ferroelectric layer in the plain parallel to the surface of the substrate more strongly. Furthermore, the reason is that when a conductive oxide having the perovskite structure is used as the first electrode layer, the crystallinity of the ferroelectric layer is improved.

Figure 6:
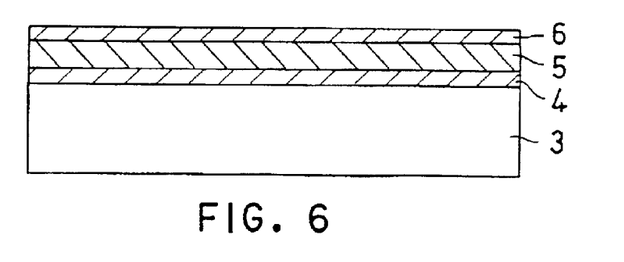
FIG. 6 is a cross sectional view of the ferroelectric infrared detection element which is an embodiment of the present invention.

FIG. 6 is a cross sectional view of the infrared detection element according to the first embodiment of the present invention.

As shown in FIG. 6, a first electrode layer 4 is formed on a single-crystalline base layer 3 composed of silicon. The thickness of the single-crystalline base layer 3 is selected between 50 nm and 10 $\mu$m. A material of the first electrode layer 4 may be any one having crystallinity and conductivity, which will not make the crystallinity worse of a ferroelectric layer 5 grown on the electrode layer 4. For example, SrRuO$_3$ is preferable, which is a conductive oxide having the perovskite structure. Further, thickness of the film forming the first electrode layer 4 may be selected so as not to adversely affect the ferroelectric layer 5 grown. It is preferable that the thickness of the film is sufficiently thinner than that of the single-crystalline base layer 3 and is thinner than that of the ferroelectric layer 5.

The single-crystalline or single-oriented ferroelectric layer 5 composed of Sr$_{1-x}$Ba$_x$TiO$_3$ is formed on the first electrode layer 4. The single-crystalline base layer 3 elastically constraines distortion of the crystal structure of the ferroelectric layer 5 in a plain parallel to the surface of the single-crystalline base layer 3. The distortion in a direction perpendicular to the surface of the single-crystalline base layer 3 is not constrained but is free. When the semiconductor layer 5 has the perovskite structure, for example, directions of "a" and "b" axes are oriented in the plain parallel to the surface of the single-crystalline base layer 3 and "c" axis is oriented in the direction perpendicularly to the surface.

A second electrode layer 6 is formed on the ferroelectric layer 5. The second electrode layer 6 preferably has crystallinity and conductivity. For example, a conductive oxide such as SrRuO$_3$ is preferable having the perovskite structure.

The infrared detection element thus formed can detect infrared light accurately with a high sensitively even in the neighborhood of the Curie temperature.

A method for manufacturing the infrared detection element and infrared detector using the element will be described.

Figure 7:
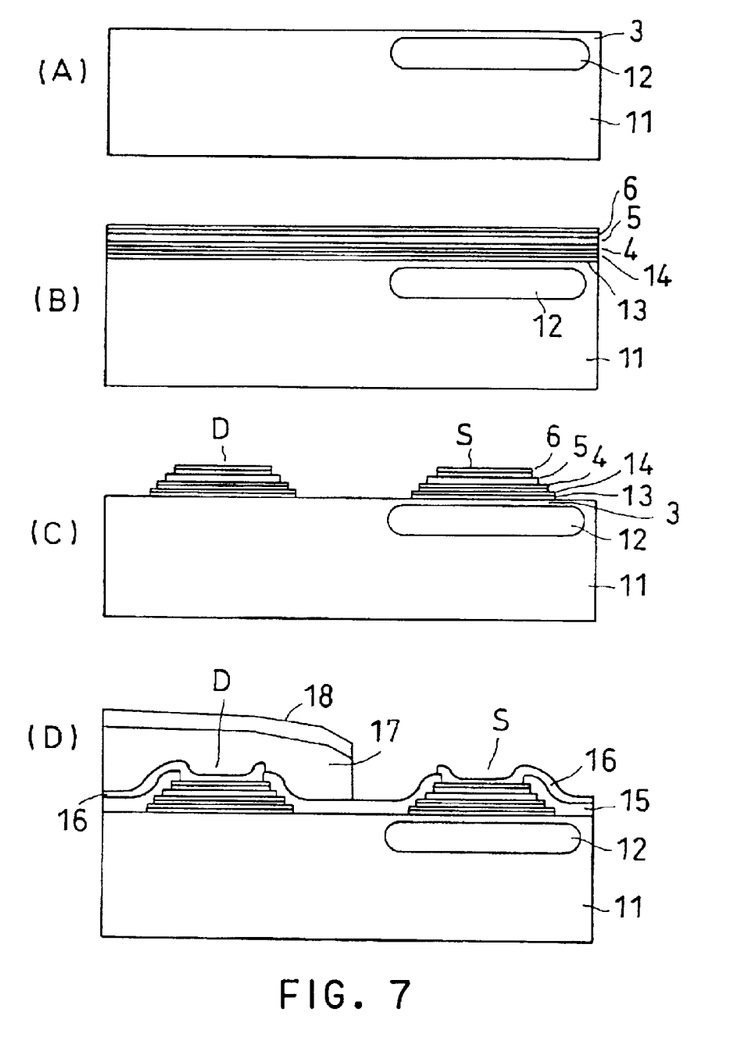
FIG. 7 is a cross sectional view showing a manufacturing process of the ferroelectric infrared detection element according to the present invention.

In a first step, a hollow 12 is formed in the neighborhood of the surface of a silicon substrate 11, having a surface oriented to (100) direction as shown in FIG. 7(a). A ceiling 3 of the hollow 12 is equivalent to the single-crystalline base layer 3 of the infrared detection layer shown in FIG. 6. The hollow 12 forms a box like inner space having a length of 50 $\mu$m, a width of 50 $\mu$m and a height of 1.5 $\mu$m. The thickness of the single-crystalline base layer 3 of the ceiling is selected to be a thickness of between 50 nm and 10 $\mu$m.

A method for forming the hollow 12 is described below.

Figure 8:
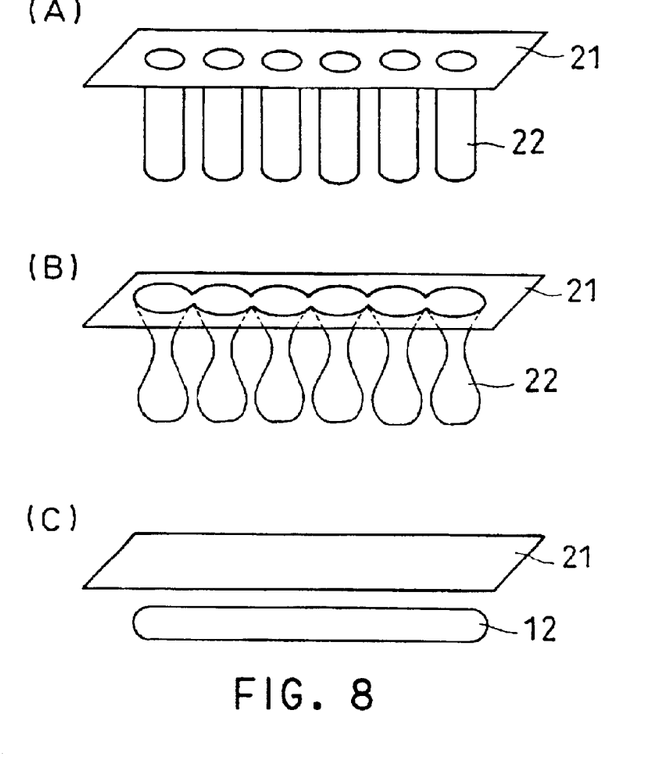
FIG. 8 is a perspective view showing a process for forming a hollow portion in a silicon substrate in a manufacturing process of the ferroelectric infrared detection element according to the present invention.

As shown in FIG. 8(a), trenches 22 are formed at a surface 21 of the silicon substrate 11 using a photolithography and reactive ion etching processes. The silicon substrate 11 in which the trenches 22 are formed is then heated and is reflowed at high temperature in a hydrogen atmosphere. As shown in FIG. 8(b), the trenches 22 are extended in the horizontal direction in the silicon substrate 11 and the holes are shrank in the neighborhood of the surface 21 of the silicon substrate 11 by the reflowing step. The trenches 22 in the silicon substrate 11 are finally connected to each other and the hollow 12 is formed as shown in FIG. 8(c). In this embodiment, the trenches 22 are formed within a range of 50 $\mu$m (length)×50 $\mu$m (width) in the silicon substrate 11.

In a second step, as shown in FIG. 7(b), a contact layer 13 composed of TiN, an insulating layer 14 composed of SrTiO$_3$, a first electrode layer 4 (lower electrode) composed of a laminated layer of Ir and SrRuO$_3$, a ferroelectric layer 5 composed of Sr$_{0.9}$Ba$_{0.1}$TiO$_3$, and a second electrode layer 6 (upper electrode) composed of a laminated layer of SrRuO$_3$ and Ir are sequentially piled up by a continuous epitaxial growth using a sputtering technique in a vacuum on the overall surface of the silicon substrate 11. The growth temperature is 600° C. for all the layers.

In a third step, as shown in FIG. 7(c), the second electrode layer 6, the ferroelectric layer 5, the first electrode layer 4, the insulating layer 14, and the contact layer 13 are sequentially processed into a trapezoidal shape by the photolithography and etching processes. The trapezoidal element shown on the right on the silicon substrate 11 is a sense cell S, which is an infrared detection element. The trapezoidal element shown on the left on the silicon substrate 11 is a reference cell D.

In a fourth step, as shown in FIG. 7(d), an inter-layer insulating film is composed of silicone oxide is formed by the CVD method. The second electrode layer 6 is exposed through openings formed over the sense cell S and the reference cell D by etching the inter-layer insulating film 17 and aluminum wire 16 is formed.

In a fifth step, an inter-layer insulating film 17 composed of silicone oxide is formed on the reference cell D by the CVD method and then an is formed on the inter-layer insulating film 17. The infrared reflection film 18 prevents the temperature due to infrared light from being transmitted to the reference cell D. In this way, an infrared detector is manufactured.

The operation principle of the infrared detection element will be explained by referring to FIG. 9.

Figure 9:
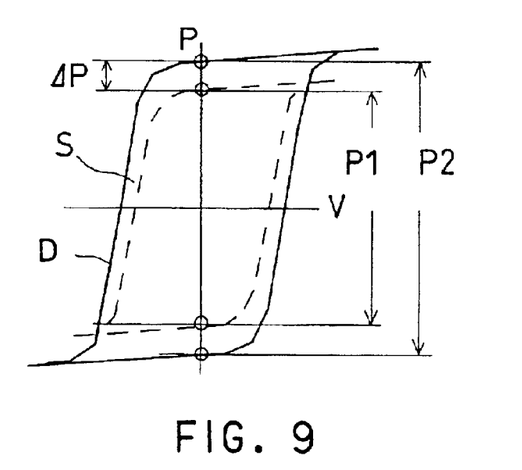
FIG. 9 is a polarization characteristic diagram for explaining an operational principle of the ferroelectric infrared detection element according to the embodiment of the present invention.

As shown by dashed lines in FIG. 9, when infrared light is irradiated to the sense cell S, the hysteresis curve representing a relation between an amount of charge and a voltage of a capacitor, which is composed of the ferroelectric layer 5 as dielectrics becomes smaller.

In the infrared detection element of the sense cell S, a potential is applied between the first and the second electrode layers 4, 6 and the magnitude P1 of a turnover charge of the ferroelectric layer 5 is detected as a voltage or a current. With respect to the reference cell D with no infrared light being irradiated, the hysteresis curve of which is shown by solid lines in FIG. 9, a potential is applied to the first and the second electrode layer 4, 6 and the magnitude P2 of turnover charge of the ferroelectric layer 5 is detected as a voltage or a current. Calculating the difference between the voltages or the currents, the temperature of the sense cell S can be measured from the properties shown in FIG. 5, for example. Preparing the infrared detector thus produced, positive and negative pulse voltages are applied between the first and the second electrode layers 4, 6 of the sense cell S and the reference cell D and turnover polarization is read out to measure the ferroelectric property. The Curie temperature of the ferroelectric layer 5 was 23° C. Then, attaching a Peltier element on the back of the substrate for keeping the temperature of the substrate constant at 22.5° C., the difference between the residual polarizations of the sense cell S and the reference cell D is detected after amplifying it by the differential amplifier. It is confirmed that the NETD index (noise equivalent temperature difference) indicating the infrared detection is 0.08° C.,which represents a very high capability.

Figure 10:
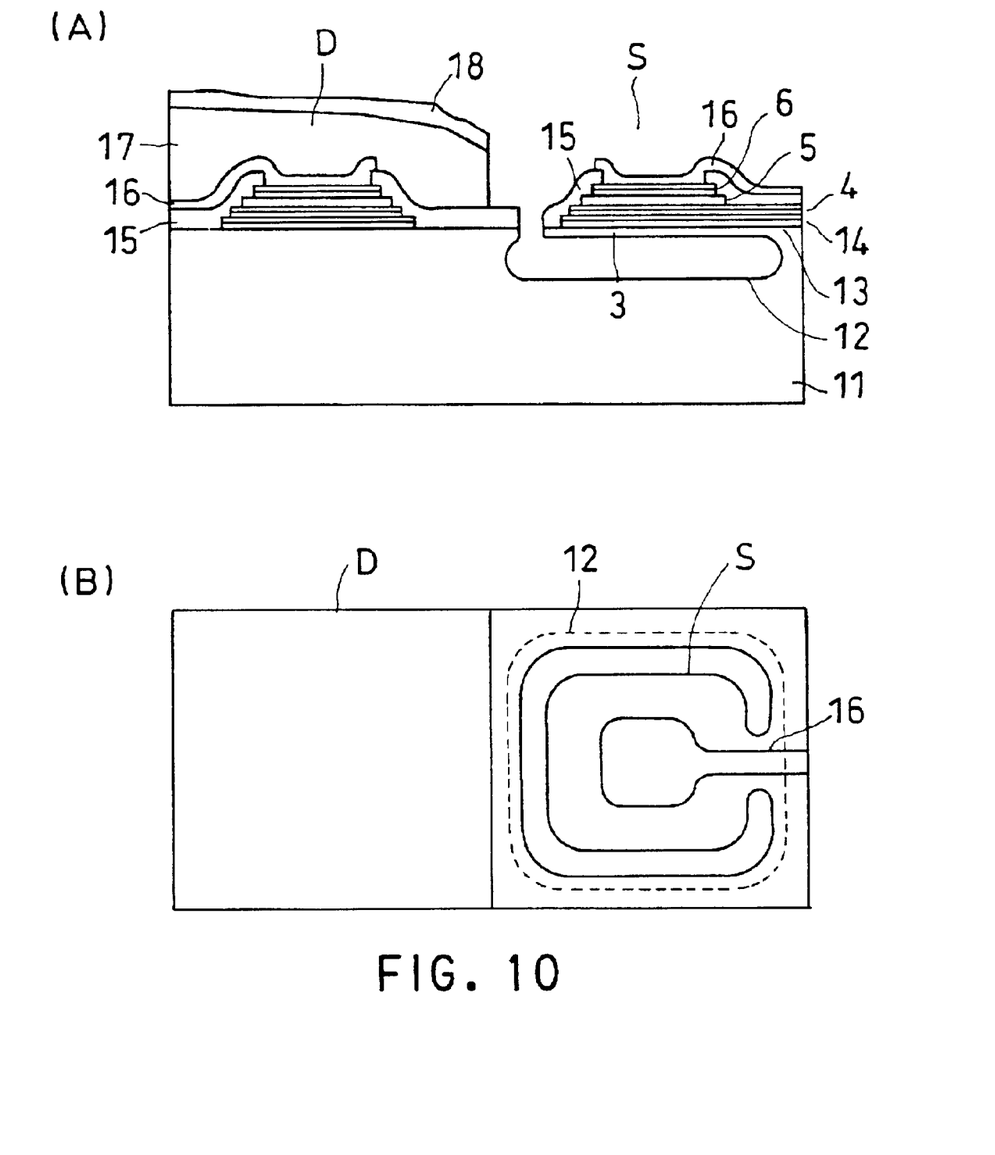
FIG. 10 shows the ferroelectric infrared detection element according to another embodiment of the present invention, wherein (a) is a cross sectional view, and (b) is a top view.

FIG. 10 shows another embodiment of the infrared detector according to the present invention. FIG. 10(a) is a cross sectional view and FIG. 10(b) is a top view of the infrared detector respectively.

In the infrared detector, the circumferential part of the ceiling 3 of the hollow 12 formed in the silicon substrate 11 is cut off (FIGS. 10(a) and (b)). Namely, the sense cell S composed of the single-crystalline base layer 3, the first electrode layer 4 (lower electrode layer), the ferroelectric layer 5, and the second electrode layer 6 (upper electrode layer) is separated from the silicon substrate 11 except for an end portion of the sense cell S.

With the main portion of the infrared detection element being separated from the silicon substrate 11 as described, high sensitivity of the cell is realized since an electric distortion is easily generated in the ferroelectric layer 5 and since the amount of heat leaking from the periphery of the sense cell S can be reduced, when the infrared light is irradiated to the sense cell S causing a change in the temperature of the ferroelectric layer 5. In the infrared detector shown in FIG. 10, the same numerals are assigned to the same parts as those shown in FIG. 7 and the detailed explanation thereof will be omitted.

In the infrared detector shown in FIG. 10, the temperature of the silicon substrate 11 is fixed at 22.5° C. by the Peltier element. Positive and negative pulse voltages are applied between the first and the second electrode layers 4, 6 of the sense cell S and the reference cell D to read the turnover polarization. The difference between the polarizations of the sense cell S and the reference cell D is detected after amplifying it by the differential amplifier. It is confirmed that the NETD index indicating the capability of the infrared detection is 0.06° C., which represents a very high accuracy.

Figure 11:
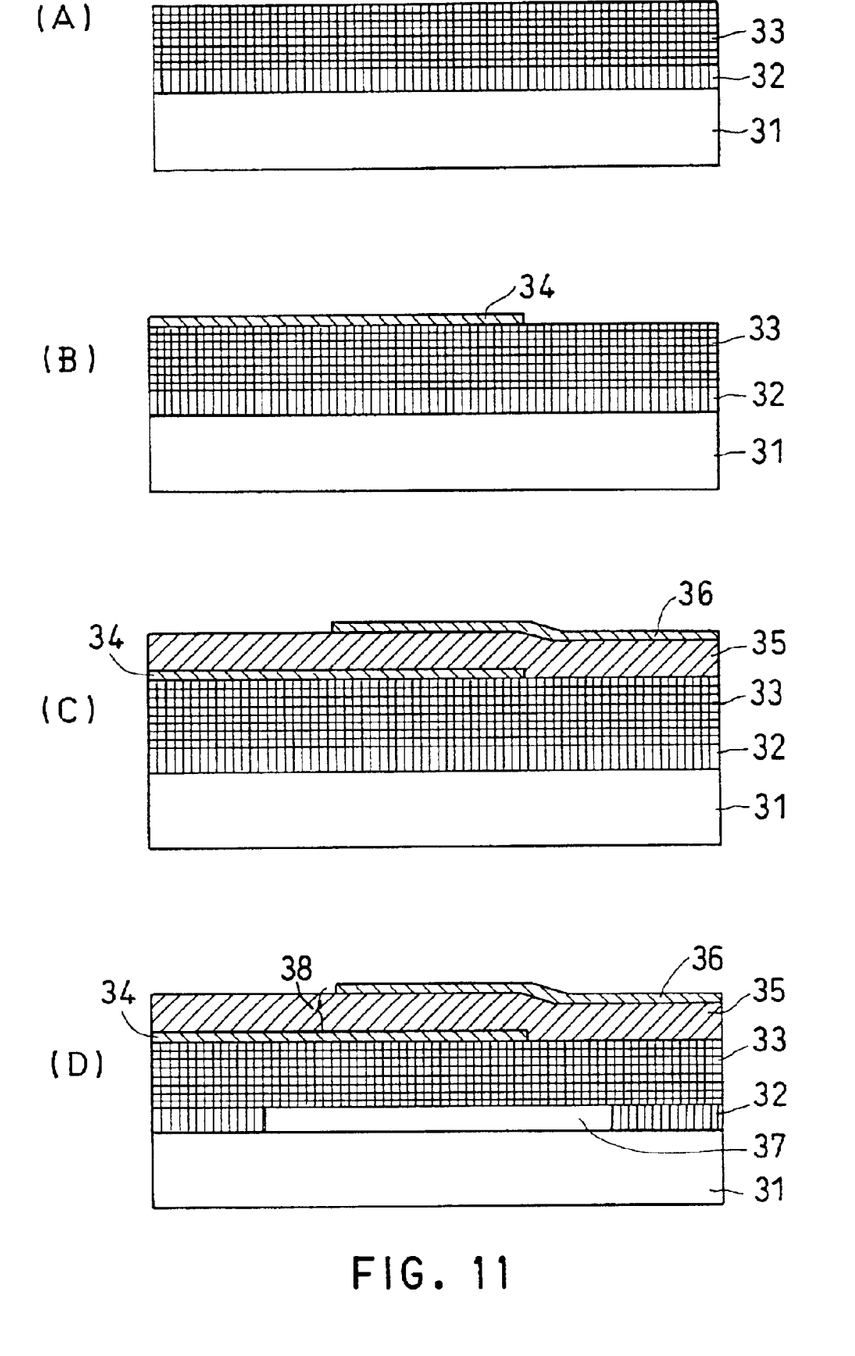
FIG. 11 shows another manufacturing process of the infrared detection element according to the present invention.

FIG. 11 is a process flow diagram showing another method for manufacturing the infrared detection element according to the present invention. In a first step, as shown in FIG. 11(a), an $SrRuO_3$ sacrifice layer 32 with a film thickness of 1 nm and an $SrTiO_3$ single-crystalline base layer 33 with a film thickness of 1.5 nm are continuously formed on the surface of an Si(100) substrate 31, with the epitaxial growth process using the RF magnetron sputtering method at a substrate temperature of 600° C.

In a second step, as shown in FIG. 11(b), a lower electrode 34 of Pt with a thickness of 100 nm is epitaxially grown by the RF magnetron sputtering method at a substrate temperature of 600° C., and then are subjected to a patterning process using photolithography and RIE processes.

In a third step, as shown in FIG. 11(c), an $Sr_{0.80}Ba_{0.2}TiO_3$ ferroelectric layer 35 with a thickness of 0.5 nm is epitaxially grown by the RF magnetron sputtering method at a substrate temperature of 600° C. An upper electrode 36 of Pt with a thickness of 100 nm is then epitaxially grown, and is then subjected to a patterning process using photolithography and RIE processes.

In a fourth step, as shown in FIG. 11(d), a hole (not shown in the drawing) is formed in each part of the upper and lower electrodes and piezo-electric layer by photolithographic and RIE processes. Selective etching of the $SrRuO_3$ sacrifice layer is carried out through the holes using cerium/ammonium nitrate of 3% concentration. A hollow 37 is formed at a portion under a sensor 38, which is composed of a base single-crystalline base layer 33, a lower electrode 34, a ferroelectric film 35, and an upper electrode 36.

By selective etching for the sacrifice layer 32 in the manner described, the infrared detection element is formed.

According to the present invention, it is possible to measure a temperature accurately with high precision even of a substance in the neighborhood of the Curie temperature by elastically constraining the crystal structure of the single crystalline layer in the plain parallel to the surface of the base single-crystalline layer, on which the ferroelectric layer is formed and by preventing the discontinuous primary phase transition due to the change of the temperature.

What is claimed is:

1. An infrared detection element, comprising:

a single-crystalline base layer with a thickness of 50 nm to 10 μm and having a principal surface, a first electrode layer formed on a principal surface of said single-crystalline layer, a ferroelectric layer, having a secondary phase transition occurring at a temperature lower than the Curie temperature, formed on said first electrode layer and composed of a single-crystalline layer or a unidirectionally oriented layer, a distortion of which is elastically constrained by said single-crystalline base layer, and a second electrode layer formed on the ferroelectric layer, wherein an amount of a charge generated in the ferroelectric layer of the infrared detection element is detected as an electric signal from said first and second electrode layers.

2. An infrared detection element according to claim 1, wherein said ferroelectric layer has a main component of $Ba_{1-x}Sr_xTiO_3$ ($0 \leq x \leq 1$).

3. An infrared detection element according to claim 1, whereinthe first electrode layer is made of a noble metal layer or of a conductive oxide layer having a perovskite structure and a thickness of 1 μm or less.

4. An infrared detection element according to claim 1, wherein said single-crystalline base layer has a surface oriented to (001) direction and the ferroelectric layer is epitaxially grown or is orientatedly grown in the (001) direction.

5. An infrared detection element comprising:

a silicon single-crystalline base layer with a thickness of 50 nm to 10 μm having a principal surface, a first electrode layer formed on a principal surface of the single-crystalline layer, a ferroelectric layer, having a pervoskite structure with a secondary phase transition occurring at a temperature lower than the Curie temperature and formed on the first electrode layer and composed of a single-crystalline layer formed by an epitaxial growth on the principal surface of the single-crystalline layer, wherein "a" and "b" axes of the ferroelectric layer are formed in a parallel to the principal surface of the single-crystalline base layer, and a "c" axes of the ferroelectric layer is formed in a direction perpendicular to the principal surface of the silicon single-crystalline base layer, and a second electrode layer formed on the ferroelectric layer, wherein an amount of a charge generated in the ferroelectric layer of the infrared detection element is detected as an electric signal from the first second electrode layers.

6. An infrared detection element according to claim 5, wherein the ferroelectric layer has a main component of $Ba_{1-x}Sr_xTiO_3$ ($0 \leq x \leq 1$).

7. An infrared detection element according to claim 1, wherein the first electrode layer is made of a noble metal layer or a conductive oxide layer having perovskite structure and a thickness of 1 μm or less.

8. An infrared detection element comprising:

a silicon single-crystalline base layer with a thickness of 50 nm to 10 μm and having a principal surface, a first electrode layer formed on a principal surface of the single-crystalline layer, a single-crystalline ferroelectric layer having a pervoskite structure with a secondary phase transition occurring at a temperature lower than the Curie temperature and formed fixedly on the first electrode layer, wherein "a" and "b" axes of the ferroelectric layer are formed in a plane parallel to the principal surface of the single-crystalline base layer, and a "c" axis of the ferroelectric layer is formed in a direction perpendicular to the principal surface of the silicon single-crystalline base layer, wherein an amount of a charge generated in the ferroelectric layer of the infrared detection element is detected as an electric signal from the first and second electrode layers.

9. An infrared detection element according to claim 8, wherein the ferroelectric layer is fixedly formed on the first electrode layer by sputtering.

10. An infrared detection element according to claim 9, wherein the ferroelectric layer has a main component of $Ba_{1-x}Sr_xTiO_3$ ($0 \leq x \leq 1$).

11. An infrared detection element according to claim 10, wherein the first electrode layer is made of a noble metal layer or a conductive oxide layer having a perovskite structure.

12. An infrared detection element, comprising:

a single-crystalline base layer with a thickness of 50 nm to 10 μm and having a principal surface, a first electrode layer formed on the principal surface of the single-crystalline layer, a first ferroelectric layer, having a perovskite structure with a secondary phase transition occurring at a temperature lower than the Curie temperature and formed on the first electrode layer and composed of a single-crystalline layer or a undirectionally oriented layer, a distortion of which is elastically constrained by the single-crystalline base layer in a plane parallel to the principal surface of the single-crystalline base layer, wherein "a" and "b" axis of the ferroelectric layer are formed in a plane parallel to the principal surface of the single-crystalline base layer, and a "c" axes of the first ferroelectric layer is formed in a direction perpendicular to the principal surface of the single-crystalline base layer, an infrared detection element having a second electrode layer formed on the first ferroelectric layer, a third electrode layer formed on the principal surface of the single-crystalline base layer, a second ferroelectric layer, having a perovskite structure with a secondary phase transition occurring at a temperature lower than the Curie temperature and formed on the first electrode layer and composed of a single-crystalline layer or a undirectionally oriented layer, a distortion of which is elastically constrained by the single-crystalline base layer in a plane parallel to the principal surface of the single-crystalline base layer, wherein "a" and "b" axis of the ferroelectric layer are formed in a plane parallel to the principal surface of the single-crystalline base layer, and a "c" axis of the second ferroelectric layer is formed in a direction perpendicular to the principal surface of the single-crystalline base layer, a reference cell having a fourth electrode layer formed on the second ferroelectric layer, and an infrared reflection film formed on the reference cell, wherein an amount of a charge generated in the first ferroelectric layer of the infrared detection element is detected as a first electric signal from the first and second electrode layers, and an amount of a charge generated in the first ferroelectric layer of the infrared detection element is detected as a second electric signal from the third and fourth electrode layers, and wherein a difference between the first and second electric signals is detected.

13. An infrared detection element according to claim 12, wherein the first and second ferroelectric layers have a main component of $Ba_{1-x}Sr_xTiO_3$ ($0 \leq x \leq 1$).

14. An infrared detection element according to claim 13, wherein the first and third electrode layers are made of a noble metal layer or a conductive oxide layer having a perovskite structure.

15. An infrared detection element according to claim 14, wherein the single-crystalline layer is a single-crystalline silicon layer having a surface oriented to (001) direction and the first and second ferroelectric layers are epitaxially grown or are orientationally grown in the (001) direction.

16. An infrared detection element, comprising:

single-crystalline base layer with a thickness of 50 nm to 10 μm having principal surface, a first electrode layer formed on the principal surface of the single-crystalline layer, a first ferroelectric layer, having a pervoskite structure with a secondary phase transition occurring at a temperature lower than the Curie temperature and composed of a single-crystalline layer which is fixed on the first electrode layer, wherein "a" and "b" axis of the ferroelectric layer are formed in a plane parallel to the principal surface of the single-crystalline base layer, and a "c" axis of the ferroelectric layer is formed in a direction perpendicular to the principal surface of the semiconductor layer, an infrared detection element having a second electrode layer formed on the ferroelectric layer, a third electrode layer formed on the principal surface of the single-crystalline base layer, a second ferroelectric layer, having a pervoskite structure with a secondary phase transition occurring at a temperature lower than the Curie temperature and composed of a single-crystalline layer which is fixed on the third electrode layer, wherein "a" and "b" axis of the ferroelectric layer are formed parallel to the principal surface of the single-crystalline base layer, and a "c" axis of the ferroelectric layer is formed in a direction perpendicular to the principal surface of the semiconductor layer, a reference cell having a fourth electrode layer formed on the ferroelectric layer, and an infrared reflection film formed on the reference cell, wherein an amount of charge in the ferroelectric layer of the infrared detection element is detected as a first electric signal from the first and the second electrode layers, an amount of charge in the ferroelectric layer of the reference cell is detected as a second electric signal from the third and the fourth electrode layers, and a difference between the electric signals is detected.

* * * * *